United States Patent [19]
Sleight et al.

[11] Patent Number: 5,919,720
[45] Date of Patent: Jul. 6, 1999

[54] MATERIALS WITH LOW OR NEGATIVE THERMAL EXPANSION

[75] Inventors: Arthur W. Sleight, Philomath, Oreg.; Mary A. Thundathil, Tamilnadu, India; John S. O. Evans, Oxford, United Kingdom

[73] Assignee: State of Oregon Acting By and Through The State Board of Higher Education On Behalf of Oregon State University, Corvallis, Oreg.

[21] Appl. No.: 09/059,679

[22] Filed: Apr. 13, 1998

Related U.S. Application Data

[60] Provisional application No. 60/043,024, Apr. 15, 1997.
[51] Int. Cl.$^6$ .................................................. C04B 35/10
[52] U.S. Cl. ........................ 501/126; 501/127; 501/152; 501/153
[58] Field of Search ..................................... 501/126, 127, 501/152, 153

[56] References Cited

U.S. PATENT DOCUMENTS

| | | | |
|---|---|---|---|
| 4,675,302 | 6/1987 | Roy et al. ................................ | 501/123 |
| 4,801,566 | 1/1989 | Limaye et al. ........................... | 501/104 |
| 5,322,559 | 6/1994 | Sleight .................................... | 106/401 |
| 5,433,778 | 7/1995 | Sleight .................................... | 106/401 |
| 5,488,018 | 1/1996 | Limaye .................................... | 501/104 |
| 5,514,360 | 5/1996 | Sleight et al. ........................... | 423/593 |

OTHER PUBLICATIONS

Charles Martinek and F.A. Hummel, "Linear Thermal Expansion of Three Tungstates", *Journal of The American Ceramic Society*, vol. 54, No. 4, 1967.

J.S.O. Evans, et al., "Structure of $Zr_2(WO_4)(PO_4)_2$ from powder X–Ray Data: Cation Ordering with No Structures", *Journal of Solid State Chemistry*, 120, 101–104(1995).

A.W. Sleight, et al., "A New Ferroelastic Transition in Some $A_2(MO_4)_3$ Molybdates and Tungstates", *Journal of Solid State Chemistry*, 7, 172–174(1993).

Gmelin Handbook W Suppl. vol. B5 pp. 8–11(1998).

T.A. Mary et al., "Negative Thermal Expansion from 0.3 to 1050 Kelin in $ZrW_2O_8$", *Science*, vol. 272(1996).

J.S.O. Evans, et al., "Compressibility, Phase Transitions, and Oxygen Migration in Zirconium Tungstate, $ZrW_2O_8$", *Science*, vol. 275(1997).

J.S.O. Evans, "Negative Thermal Expansion in $ZrW_2O_8$ and $HfW_2O_8$", *Chemistry of Materials*, vol. 8, No. 12, pp. 2809–2823(1996).

J.S.O. Evans et al., "Negative Thermal Expansion in $Sc_2(WO_4)_3$", *Department of Chemistry and Center for Advanced Materials Research*, Oregon State University, Corvallis, Oregon (1997).

Alexander K.A. Pryde et al., "Orgin of the negative thermal expansion in $ZrW_2O_8$ and $ZrV_2O_7$", *J. Phys.*, Condens. Matter 8 (1996).

*Primary Examiner*—Paul Marcantoni
*Attorney, Agent, or Firm*—Klarquist Sparkman Campbell Leigh & Whinston, LLC

[57] ABSTRACT

Low or negative thermal expansion compounds are described having a formula of $A_{2-x}^{3+}A_y^{4+}M_z^{3+}M_{3-y}^{6+}P_yO_{12}$. It currently is believed that y can vary from about 0 to about 2, x equals the sum of y and z and varies from about 0.1 to about 1.9. Without limitation, novel compounds satisfying the formula $A_{2-x}^{3+}A_y^{4+}M_z^{3+}M_{3-y}^{6+}P_yO_{12}$ where y=0 may be selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$ and $ErInW_3O_{12}$. Without limitation, novel compounds satisfying the formula $A_{2-x}^{3+}A_y^{4+}M_z^{3+}M_{3-y}^{6+}P_yO_{12}$ where y=2 may be selected from the group consisting of $Hf_2WP_2O_{12}$ and $Hf_2MoP_2O_{12}$. The present invention also provides compositions useful for decreasing the positive thermal expansion of a material or materials included in the compositions. The compositions comprise at least a first material and a second material where the first material has low or negative thermal expansion properties and the second material exhibits positive thermal expansion. Novel compositions and methods for making and using such compositions can be made using a first material selected, without limitation, from the group consisting of $Al_2W_3O_{12}$, $Al_2Mo_3O_{12}$, $In_2W_3O_{12}$, $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$, $Al_{1.68}Sc_{0.02}In_{0.3}W_3O_{12}$, $Zr_2WP_2O_{12}$, $Zr_2MoP_2O_{12}$, $Hf_2WP_2O_{12}$ and $Hf_2MoP_2O_{12}$. A general method for making compounds having low or negative thermal expansion, and compositions containing such compounds, also is described. The first step of the method comprises purposefully designing compounds to be low or negative thermal expansion compounds according to rules derived empirically. The second step comprises making those compounds designed according to the rules. Examples of negative thermal expansion materials made by such method include $NbO_2F$ and $TaO_2F$.

24 Claims, 3 Drawing Sheets

$Hf_2WP_2O_{12}$

Indium Aluminimum Tungstate $Al_{1.6}In_{0.4}(WO_4)_3$

MATERIALS WITH LOW OR NEGATIVE THERMAL EXPANSION

CROSS REFERENCE TO RELATED APPLICATION

This application claims priority from copending U.S. Provisional Patent Application No. 60/043,024, filed on Apr. 15, 1997, which is incorporated herein by reference.

FIELD OF THE INVENTION

The present invention concerns materials having low or negative thermal expansion properties, particularly tungstate and molybdate compounds, compositions containing such materials and methods for making the materials and compositions.

BACKGROUND OF THE INVENTION

Most materials expand when heated as a consequence of the enhanced magnitude of thermal vibrations. See Robert Cahn's "Thermal Contraction of Oxides and Metals," Nature, 386:22–23 (March, 1997). Although unusual, certain materials are known that contract when heated. These materials also have thermal vibrations with enhanced magnitudes as a consequence of heating, and contraction on heating therefore must occur by some compensating mechanism or mechanisms. Some materials, such as the tungstate compounds, have bond vibrations that are postulated to cause concomitant shortening of other distances, which results in low or negative thermal expansion (NTE) properties. Additional discussion concerning proposed mechanisms for negative thermal expansion is provided by (1) Evans et al., Chem. Mater., 8:2809–2823 (1996), and (2) Sleight, Endeavor, 19:64–68 (1995).

Materials having very low thermal expansion are useful primarily because of their resistance to damage from thermal shock on rapid heating or rapid cooling. There are applications for negative thermal expansion materials in a pure form. However, the primary applications for such materials is to adjust to lower values the thermal expansion of metal-, oxide- or polymer-based compositions. Some negative thermal expansion materials are known which expand or contract isotropically. "Isotropic" refers to equal expansion or contraction in all dimensions. Examples of negative thermal expansion materials that expand and contract isotropically include (1) $ZrVPO_7$, $HfVPO_7$ and related compounds, discussed in Sleight's U.S. Pat. Nos. 5,322,559 and 5,433,778, and (2) $ZrW_2O_8$ and $HfW_2O_8$, discussed in Sleight et al.'s U.S. Pat. No. 5,514,360. U.S. Pat. Nos. 5,322,559, 5,433,778 and 5,514,360 are incorporated herein by reference. Both cubic and amorphous solids must provide isotropic thermal expansion. Most of the known isotropic negative thermal expansion materials have cubic crystal structures, and the symmetry of the cubic structures forces materials to expand and contract equally in all dimensions.

Anisotropic expansion means that crystallites of a compound expand in certain dimensions while contracting in at least one dimension. The magnitude of the contraction (negative expansion) in a first direction may be offset by expansion in a second direction. Hence, even though the sum of the expansion in all dimensions (the bulk expansion) may be negative, the magnitude of the negative expansion is reduced. Although isotropic materials generally are preferred, anisotropic materials also are useful. But, a material can expand or contract too anisotropically to be useful for a particular application. For example, anisotropic expansion or contraction can cause cracking in brittle materials, such as ceramics, especially when used in pure form rather than as composites.

In addition to Sleight's negative thermal expansion materials mentioned above, other low or negative thermal expansion materials are known. For example, β-eucryptite exhibits a very small volume thermal expansion. Apparently, β-eucryptite expands in one direction of the material's unit cell (a unit cell is defined as the simplest, three dimensional polyhedron that by indefinite repetition makes up the lattice of a crystal and embodies all the characteristics of its structure), and contracts in a second direction. "Thermal Contraction of β-Eucryptite ($Li_2O.Al_2O_3.2SiO_2$) by X-ray and Dilatometer Methods," J. Am. Ceram. Soc., 42:175–177 (1959). The overall thermal expansion of β-eucryptite is reported to be either slightly positive or slightly negative. Zirconyl phosphate $[(ZrO)_2P_2O_7]$ is a largely anisotropic material that expands in two directions while actually contracting in only one direction. More specifically, the a and c axes of the unit cell for $(ZrO)_2P_2O_7$ expand continuously with increasing temperature, while the b axis contracts. The net effect is a small volume contraction over a limited temperature range. "Low-Thermal-Expansion Polycrystalline Zirconyl Phosphate Ceramic," J. Am. Ceram. Soc., 68:273–278 (1985). Scandium tungstate $[Sc_2(WO_4)_3]$ apparently has negative thermal coefficients in two dimensions and a positive thermal coefficient in a third dimension. V. A. Balashov et al's "Growth and Certain Properties of $Sc_2(WO_4)_3$ Crystals," translated from Izvestiya Akademii Nauk SSSR, Neorganicheskie Matenaly, 11(9): 1712–1714 (1975). There is some disagreement, however, concerning the magnitude and directions of the thermal coefficients for scandium tungstate. Moreover, the thermal expansion of scandium tungstate is highly anisotropic.

Most known compounds that exhibit NTE do so only well below room temperature or well above room temperature. Low temperature examples include $Cu_2O$, Si and amorphous $SiO_2$. High-temperature examples include $ZrV_2O_7$ and crystalline forms of $SiO_2$. Such materials are not suitable for most applications because useful temperatures for most applications generally are about room temperature. Compounds which do show NTE at room temperature (e.g., β-eucryptite) are highly anisotropic. There is thus a need for new materials which show NTE at room temperature, particularly if they are isotropic or nearly so. There also is a need for a family of compounds whereby thermal expansion can be varied from slightly positive, to zero, to strongly negative. Such a family also is needed so that other important properties, such as density, refractive index and dielectric properties can be varied and optimized for particular applications.

SUMMARY OF THE INVENTION

The present invention provides a novel, homologous class of low or negative thermal expansion materials. There are several advantages provided by the present compounds, and compositions comprising such compounds. For example, the homologous class contains many low or negative thermal expansion materials. This allows designing compounds having varying thermal expansion properties, densities, refractive indices, etc. Moreover, most compounds of the present invention are stable to very high temperatures (eg., ≈1,500° C.), which is significantly higher than most known compounds that also exhibit low or negative thermal expansion. This may allow such materials to be sintered sufficiently to form ceramic materials. Finally, most of the compounds can be produced inexpensively using the synthetic techniques described below.

Novel compounds according to the present invention generally satisfy the formula $A_{2-x}^{3+}A_y^{4+}M_z^{3+}M_{3-y}^{6+}P_yO_{12}$. It currently is believed that y can vary from about 0 to about 2. x equals the sum of y and z and varies from about 0.1 to about 1.9. x, y and z need not be positive integers and instead can be fractions of positive integers. Without limitation, novel compounds satisfying the formula $A_{2-x}^{3+}A_y^{4+}M_z^{3+}M_{3-y}^{6+}P_yO_{12}$ where y=0 may be selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$ and $ErInW_3O_{12}$. Without limitation, novel compounds satisfying the formula $A_{2-x}^{3+}A_y^{4+}M_z^{3+}M_{3-y}^{6+}P_yO_{12}$ where y=2 may be selected from the group consisting of $Hf_2WP_2O_{12}$ and $Hf_2MoP_2O_{12}$.

Certain of the present novel compounds further satisfy the formula $Al_{2-x}In_xW_3O_{12}$ where x is from about 0.1 to about 1.9. Compounds that have been made and which satisfy this second formula may be selected from the group consisting of $Al_{1.5}In_{0.5}W_3O_{12}$, $Al_{1.6}In_{0.4}W_3O_{12}$, $Al_{1.7}In_{0.3}W_3O_{12}$ and $Al_{1.8}In_{0.2}W_3O_{12}$.

The present invention also provides compositions useful for decreasing the positive thermal expansion of a material or materials included in the compositions. The compositions comprise at least a first material and a second material where the first material has low or negative thermal expansion properties and the second material exhibits positive thermal expansion. An amount of the first material effective to form a composition having a decreased positive thermal expansion relative to the second material is added to the second material to form desired compositions. A method for making such compositions also is described.

The first material has a formula of $A_{2-x}^{3+}A_y^{4+}M_z^{3+}M_{3-y}^{6+}P_yO_{12}$. It currently is believed that y can vary from about 0 to about 2. x equals the sum of y and z and varies from 0 to 2. Novel compositions, and methods for making and using such compositions, can be made using compounds selected, without limitation, from the group consisting of $Al_2W_3O_{12}$, $Al_2Mo_3O_{12}$, $In_2W_3O_{12}$, $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$, $Al_{1.68}Sc_{0.02}In_{0.3}W_3O_{12}$, $Zr_2WP_2O_{12}$, $Zr_2MoP_2O_{12}$, $Hf_2WP_2O_{12}$ and $Hf_2MoP_2O_{12}$.

Finally, a general method for making compounds having low or negative thermal expansion, and compositions containing such compounds, is described. The first step of the method comprises purposefully designing compounds to be low or negative thermal expansion compounds according to rules derived empirically. The second step comprises making those compounds designed according to the rules. Examples of negative thermal expansion materials made by such method include $NbO_2F$ and $TaO_2F$.

DETAILED DESCRIPTION OF THE PREFERRED EMBODIMENTS

I. General Molecular Formulas

Figure 1:
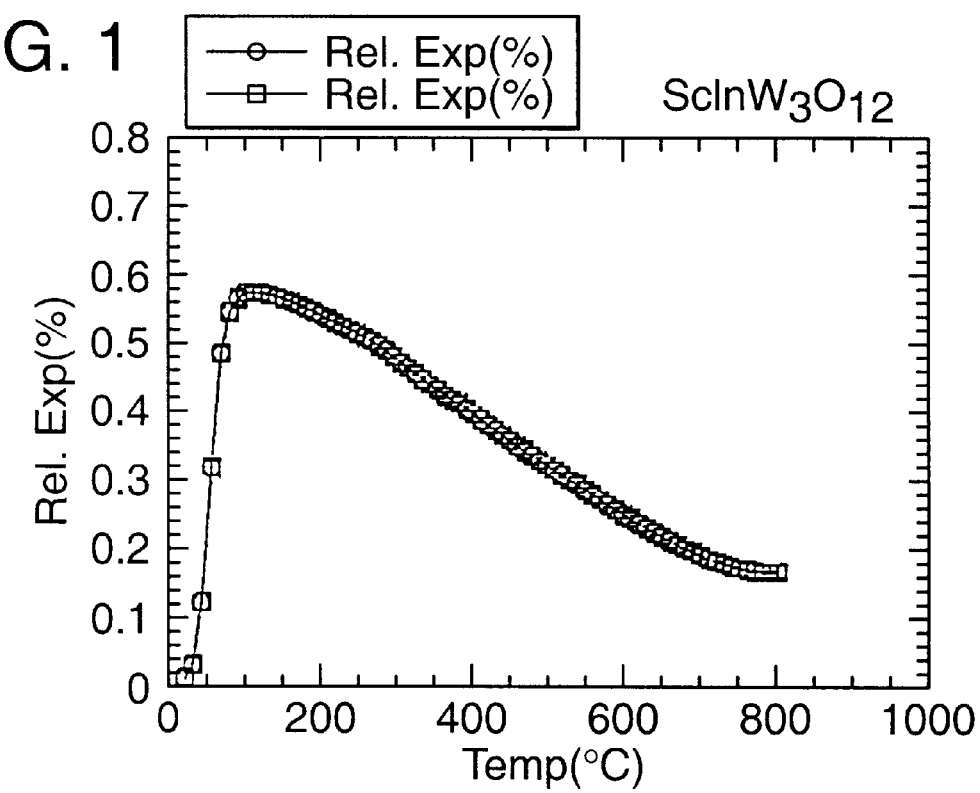
FIG. 1 is a thermal expansion curve illustrating the relative thermal expansion (%) of $ScInW_3O_{12}$ over a temperature range of from about 0° C. to about 800° C.

The present invention provides novel low or negative thermal expansion compounds. These novel compounds satisfy Formula 1

$$A_{2-x}^{3+}A_y^{4+}M_z^{3+}M_{3-y}^{6+}P_yO_{12} \qquad \text{FORMULA 1}$$

where $A^{3+}$ is a metal having an oxidation state of plus 3, $A^{4+}$ is a metal having an oxidation state of plus 4, $M^{3+}$ is a metal having an oxidation state of plus 3, and $M^{6+}$ is a metal having an oxidation state of plus 6. It currently is believed that y can vary from about 0 to about 2. x is equal to the sum of y and z. x, y and z need not be positive integers and instead can be fractions of positive integers.

Compounds have been made where y is either 0 or 2. If y=0, x is from about 0.1 to about 1.9, z=x, and $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof. Examples of compounds satisfying this formula where y=0 may be selected, without limitation, from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$ and $ErInW_3O_{12}$.

If y=1, x=1+z, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

If y=2, x=2, z=0, $A^{4+}$ is Hf, and $M^{6+}$ is W, Mo, or mixtures thereof. Examples of compounds satisfying this formula where y=2 may be selected from the group consisting of $Hf_2WP_2O_{12}$ and $Hf_2MoP_2O_{12}$.

The aluminum-indium series, while fully represented by Formula 1, also can be represented by Formula 2 as a subset of the compounds satisfying Formula 1. Formula 2 is set forth below

$$Al_{2-x}In_xW_3O_{12} \qquad \text{FORMULA 2}$$

where x is from about 0.1 to about 1.9. X-ray diffraction data shows that these compounds are isostructural with $Al_2W_3O_{12}$. Unit cell edges are 9.185×12.675×9.012 Å for x=0.2; 9.229×12.770×9.150 Å for x=0.4; 9.249×12.764× 9.151 Å for x=0.5; and 9.394×12.937×9.269 Å for x=1.0.

Various stoichiometric substitutions also can be made for indium in Formula 2 to provide additional compounds. These additional compounds can be represented by Formula 3

$$Al_{2-(x+y)}M_xM''_yW_3O_{12} \qquad \text{FORMULA 3}$$

where In in Formula 2 is now $M_xM''_y$ in Formula 3 and the sum of x+y is from about 0.1 to about 1.9. $Al_{1.68}Sc_{0.02}In_{0.3}W_3O_{12}$ is an example of a compound satisfying Formula 3 and demonstrates that mixtures of metals can be used to produce materials, such as tungstate and molybdate compounds, having low or negative thermal expansion. More specifically and with reference to $Al_{1.68}Sc_{0.02}In_{0.3}W_3O_{12}$, $M_z^{3+}$ of Formula 1 is $M_xM''_y$ in Formula 3 where $M_x$ is Sc and $M_y''$ is In and where $x=0.02$ and $y=0.3$. $Al_{1.68}Sc_{0.02}In_{0.3}W_3O_{12}$ also is an example of a material having substantially zero thermal expansion. See Example 4 below.

Each compound represented by Formulas 1–3 can be made according to the synthetic methodology discussed below.

Compounds satisfying Formula 1 exhibit very low positive thermal expansion or NTE. Most expand anisotropically, although for some compounds the expansion is close to isotropic. Furthermore, some compounds undergo a phase transition at some temperature. Below this phase transition the thermal expansion is positive. Without limiting the present invention to one theory of operation, it appears that the crystal structure for most NTE compounds is a factor in determining whether high positive thermal expansion, low positive expansion or negative thermal expansion will be exhibited by such compounds. The ideal structure for low or negative thermal expansion for compounds of the present invention currently appears to be orthorhombic (space group Pmca, with appropriate cell edges of about $9 \times 12 \times 9$ Å). All compounds made according to the present invention have this ideal structure at some temperature range, and generally at higher temperatures. Some of the compounds according to the present invention have such structure at all temperatures tested to date.

Compounds satisfying Formula 1 also have NTE onset temperatures over a wide range of temperatures, including room temperature. Moreover, such compounds can be designed to have thermal expansion coefficients of varying magnitudes. See Table 1 below. For example, $Al_{1.68}Sc_{0.02}In_{0.3}W_3O_{12}$ was made to confirm that compounds could be designed to have virtually zero thermal expansion, at least within the error limits of the equipment used to measure thermal expansion.

The present invention also provides compositions comprising a compound or compounds having low or negative thermal expansion and a compound or compounds having positive thermal expansion. The low or negative thermal expansion material (or materials) "buffers" the thermal expansion of the positive thermally expanding material or materials. Such compositions include a low or negative thermal expansion material or materials satisfying Formula 1. y can vary from about 0 to about 2, and x equals the sum of y and z.

If $y=0$, then for novel compositions, or methods of making or using such compositions, x can be either (1) from about 0.1 to about 1.9, or (2) from about 0 to about 2. If $y=0$ and x is from about 0.1 to about 1.9, $z=x$, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof. Novel compositions, and methods for making and using such compositions, can be made using compounds selected, without limitation, from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, and $ErInW_3O_{12}$. As with the novel compounds, stoichiometric substitutions also can be made for indium, so that compounds such as $Al_{1.68}Sc_{0.02}In_{0.3}W_3O_{12}$ also can be used to form novel compositions.

If $y=0$ and x is from about 0 to about 2, $z=x$, $A^{3+}$ and $M^{3+}$ are selected from the group consisting of Al, Cr, Er, Fe, Ga, Ho, In, Lu, Tm, Y, Yb, and mixtures thereof, and $M^{6+}$ is W, Mo, or mixtures thereof. Where $y=0$ and x is from 0 to 2, novel compositions and methods for making and using such compositions can be made using compounds selected, without limitation, from the group consisting of $Al_2W_3O_{12}$, $Al_2Mo_3O_{12}$, $In_2W_3O_{12}$, $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ErInW_3O_{12}$, and mixtures thereof.

If $y=1$, then $x=1+z$, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

If $y=2$, $x=2$, $z=0$, $A^{4+}$ is selected from the group consisting of Hf, Zr, and mixtures thereof, and $M^{6+}$ is W, Mo, or mixtures thereof. Where $y=2$, $x=2$ and $z=0$, novel compositions and methods for making and using such compositions can be made using compounds selected, without limitation, from the group consisting of $Zr_2WP_2O_{12}$, $Zr_2MoP_2O_{12}$, $Hf_2WP_2O_{12}$, $Hf_2MoP_2O_{12}$ and mixtures thereof.

II. Making Low or Negative Thermal Expansion Materials

A. General Synthetic Procedure

Compounds satisfying Formulas 1–3 may be synthesized by a variety of methods. A first general method suitable for making such compounds is to heat mixtures comprising stoichiometric ratios of reagent grade sources of each material required by a general formula, such as Formula 1. For example, sources of $A^{3+}$ and $M^{3+}$ metal species, such as sources of $Al^{3+}$ and $Sc^{3+}$, are selected. Quite often, but not necessarily, the source of such metal is an oxide, such as $ZrO_2$, $HfO_2$, $Sc_2O_3$, etc. The sources of the $A^{3+}$ and $M^{3+}$ species in Formula 1 are then mixed with a source of a metal having an oxidation state of plus 6, which again often, but not necessarily, is an oxide such as $WO_3$ and $MoO_3$. An intimate mixture of such reactants is then heated to a temperature range of from about 900° C. to about 1,250° C. Different reactants can be used to provide different elements, and the amount of each reactant used can be varied to provide a product having particular stoichiometric ratios of constituent elements.

During the heating process, it is not uncommon to regrind the reactants and reheat the reground reactants to assure complete reaction. The container used to hold the reactants during heating can be any suitable container, such as crucible or a sealed tube. Particular crucibles used to form the present compounds were made from platinum metal and aluminum oxide. Sealed silica tubes also have been used as containers for heating intimate mixtures of the reactants.

The temperature to which the reactants are heated depends on several factors, including the rate of reactivity of the reactants and the stability of the product. For instance, certain reactants may not be stable at certain temperatures within the temperature range of from about 900° C. to about 1,250° C. However, it also is the case that reaction rates for the reactants used to form such compounds are inconveniently slow at temperatures below about 900° C.

B. Alternative Synthetic Procedure

Alternative synthetic procedures may be used to make the compounds of the present invention. One such alternate synthetic route comprises first forming an aqueous solution comprising water-soluble reactants, such as oxychlorides or nitrates, which provide the desired metal species designated by Formulas 1–3. The aqueous solutions are heated to a temperature of from about 80° C. to about 100° C., and more preferably about 90° C. A precipitate forms during the process. The precipitate is isolated, perhaps ground as discussed above, and then heated for a period of time and to a temperature sufficient to form the desired product, such as temperatures from about 650° C. to about 900° C. A common heating temperature for this second synthetic approach is about 700° C. Heating is continued until a substantially single-phase product is obtained. This generally has found to take at least 4 hours, but heating times may vary.

III. EXAMPLES

The following examples are provided solely to illustrate certain features of the present invention. These examples should not be construed to limit the present invention to the particular features exemplified.

The structure and purity of compounds made according to the principles illustrated in the examples were determined by X-ray diffraction data. Powder X-ray diffraction data were recorded using Cu K α radiation with a Siemens D5000 diffractometer equipped with vertical Soller slits, computer-controlled antiscatter slits, and an energy-dispersive Kevex detector. Variable-temperature control was achieved using an in-house-designed resistively heated aluminum sample holder. Sample temperatures were read using a type K thermocouple situated next to the heater elements. High-temperature spectra were recorded with a step size of 0.02° 2 α and a step time of 0.5 second. Longer step times were used (7 seconds) for spectra used for detailed Rietveld analysis.

Thermal analyses were performed on samples made according to the examples and shown to be single-phase products by X-ray diffraction. A Netzsch thermal analysis system was used to obtain DSC and dilatometer data. Fused silica was used for the internal components of the dilatometer. A sapphire standard was used for calibration purposes.

IR data were recorded using KBr pellets on a Briker IFS 66V FT-Ir spectrometer with 64 scans and a resolution of 1 $cm^{-1}$. Raman spectra were recorded on a DILOR Z24 single-channel Raman spectrometer using an argon ion laser with 488 nm exciting line and 300 mW power.

Example 1

This example describes the preparation of $ScInW_3O_{12}$. 0.4597 grams of $Sc_2O_3$ (FW=137.91; 0.0033 moles), 0.9250 grams of $In_2O_3$ (FW=277.64; 0.0033 moles) and 4.637 grams of $WO_3$ (FW=231.85; 0.02 moles) were ground together using an agate mortar and pestle. This intimate mixture was placed in a platinum crucible and heated in air at 1,000° C. for 10 hours. The mixture was reground and heated at 1,080° C. for 12 hours. IR spectra, Raman spectra and X-ray diffraction showed a single-phase product, with the product being isostructural with $Sc_2W_3O_{12}$.

FIG. 1 is a thermal expansion curve for $ScInW_3O_{12}$, which was made according to Example 1. FIG. 1 shows that $ScInW_3O_{12}$ has positive thermal expansion until heated to a temperature of about 100° C. Thereafter, $ScInW_3O_{12}$ shows strong negative thermal expansion over the temperature range of from about 100° C. to above about 700° C.

Example 2

This example describes the preparation of $ErInW_3O_{12}$. 0.6375 grams of $Er_2O_3$ (FW=382.52; 0.00166 moles), 0.4622 grams of $In_2O_3$ (0.00166 moles) and 2.3185 grams of $WO_3$ (0.01 moles) were ground together using an agate mortar and pestle. This intimate mixture was placed in an aluminum oxide boat and heated in air at 1,000° C. for 16 hours. The mixture was reground and heated at 1,050° C. for 2 hours and then heated at 1,000° C. for 5 hours. The mixture was then reground and heated at 1,100° C. for 12 hours. IR spectra, Raman spectra and X-ray diffraction showed a single-phase product, with the product being isostructural with $Sc_2W_3O_{12}$.

Figure 2:
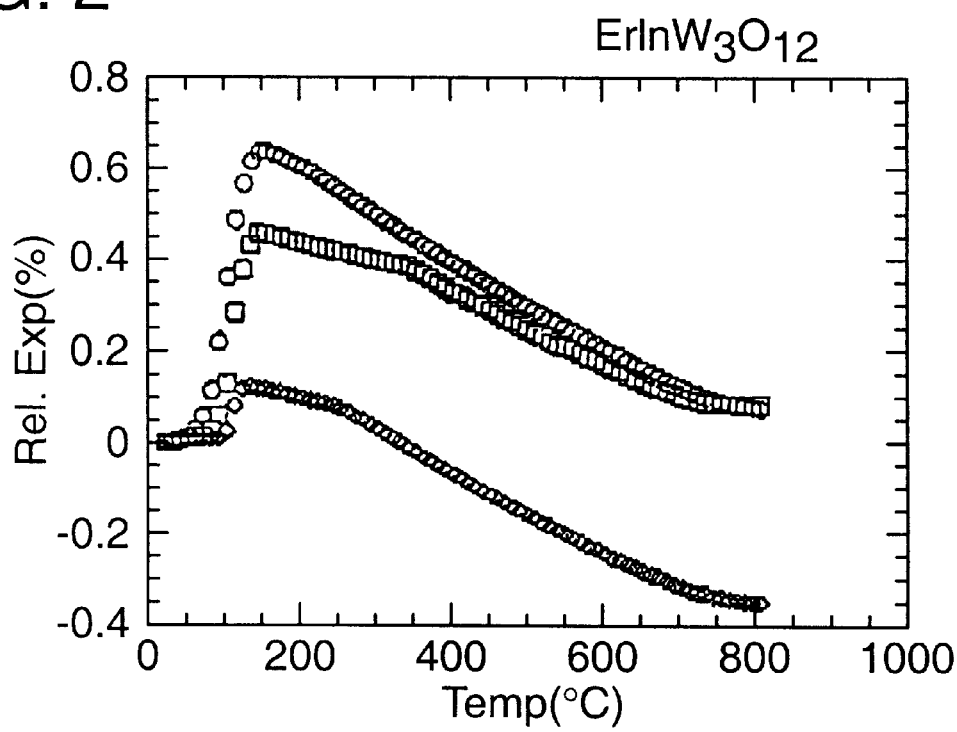
FIG. 2 is a thermal expansion curve illustrating the relative thermal expansion (%) of $ErInW_3O_{12}$ over a temperature range of from about 0° C. to about 800° C.

FIG. 2 is a thermal expansion curve for $ErInW_3O_{12}$, which was made according to Example 2. FIG. 2 shows that $ErInW_3O_{12}$ has positive thermal expansion until heated to a temperature of about 100° C. Thereafter, $ErInW_3O_{12}$ shows strong negative thermal expansion over the temperature range of from about 100° C. to at least about 800° C. FIG. 2 shows several curves for the relative expansion of $ErInW_3O_{12}$. This indicates that the magnitude of the relative thermal expansion varied from trial to trial, but all measurements agree that this material exhibits negative thermal expansion over the temperature range tested.

Thermal expansion is generally measured either by dilatometry or by X-ray diffraction. Thermal expansion results obtained by diffraction are always reproducible because only how the unit-cell dimensions change with temperature is measured. When thermal expansion is measured by dilatometry, sometimes an additional contribution to thermal expansion occurs: the microstructure may change as temperature changes, leading to a different void volume between crystallites. Some of the bars produced for dilatometry analysis have up to 25% void volume. The effect of this is some variation in thermal expansion on different samples and on recycling the same sample. Such behavior is commonly reported in the literature for other anisotropic materials. This effect frequently causes disagreement between dilatometer and diffraction results. This effect appears always to be absent from isotropic materials, which is one additional advantage of isotropic, or nearly isotropic, materials. For example, with $Al_{1.6}In_{0.4}W_3O_{12}$, which is nearly isotropic, good agreement is obtained between dilatometer and diffraction results.

Example 3

This example describes the preparation of $HoScW_3O_{12}$. 0.2299 grams of $Sc_2O_3$ (FW=137.910.; 0.00166 moles), 0.6298 grams of $Ho_2O_3$ (FW=377.86; 0.00166 moles) and 2.3185 grams of $WO_3$ (FW=231.85; 0.01 moles) were ground together using an agate mortar and pestle. This intimate mixture was heated in a platinum crucible in air at 1,000° C. for 16 hours. The mixture was reground and heated at 1,050° C. for 10 hours. IR spectra, Raman spectra and X-ray diffraction showed a single-phase product, the product being isostructural with $Sc_2W_3O_{12}$.

Figure 3:
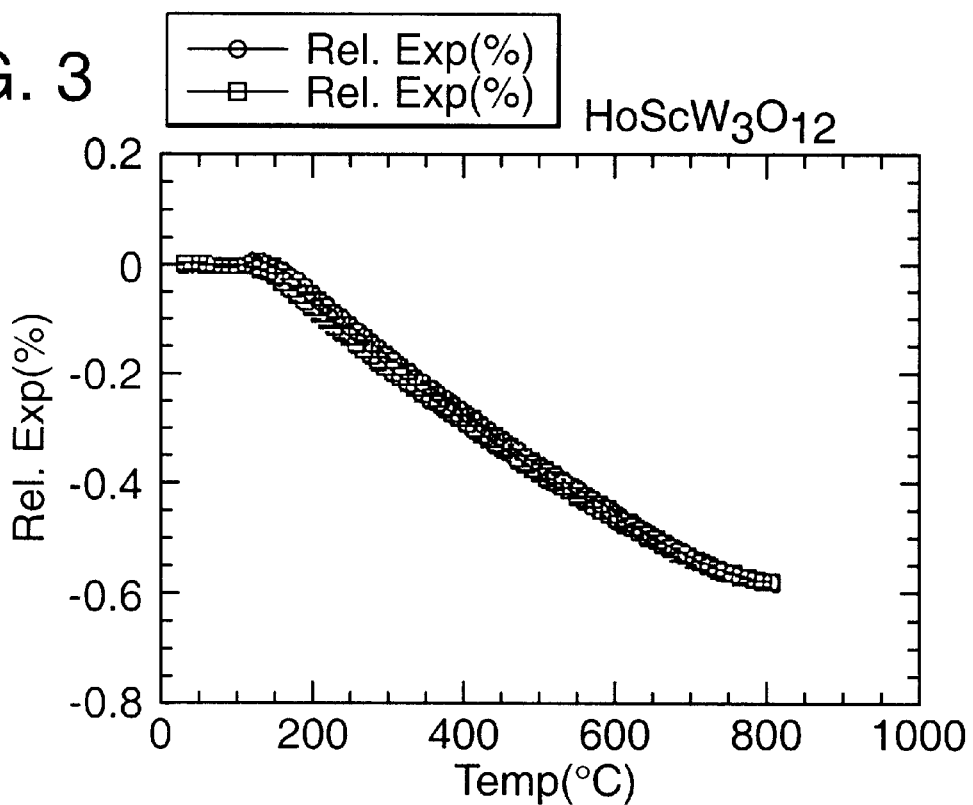
FIG. 3 is a thermal expansion curve illustrating the relative thermal expansion (%) of $HoScW_3O_{12}$ over a temperature range of from about 0° C. to about 800° C.

FIG. 3 is a thermal expansion curve for $HoScW_3O_{12}$, which was made according to Example 3. FIG. 3 shows that $HoScW_3O_{12}$ has positive thermal expansion until heated to a temperature of about 50° C.–100° C. Thereafter, $HoScW_3O_{12}$ shows strong negative thermal expansion over the temperature range of from about 100° C. to at least about 700° C.

Example 4

This example describes the preparation of $Al_{1.68}Sc_{0.02}In_{0.3}W_3O_{12}$. 1.5756 grams of $Al_2O_3$ (FW= 101.96; 0.0155 moles), 0.0069 grams of $Sc_2O_3$ (FW= 137.91; $5.0\times10^{-5}$ moles), 0.2082 grams of $In_2O_3$ (FW= 277.64; $7.49\times10^{-4}$ moles) and 3.4778 grams of $WO_3$ (FW= 231.85; 0.015 moles) were ground together using an agate mortar and pestle. This intimate mixture was heated in a alumina crucible in air at 1,000° C. for 12 hours. The mixture was reground and heated at 1,100° C. for 10 hours. IR spectra, Raman spectra and X-ray diffraction showed a single-phase product, with the product having an $Al_2W_3O_{12}$-type structure.

Figure 4:
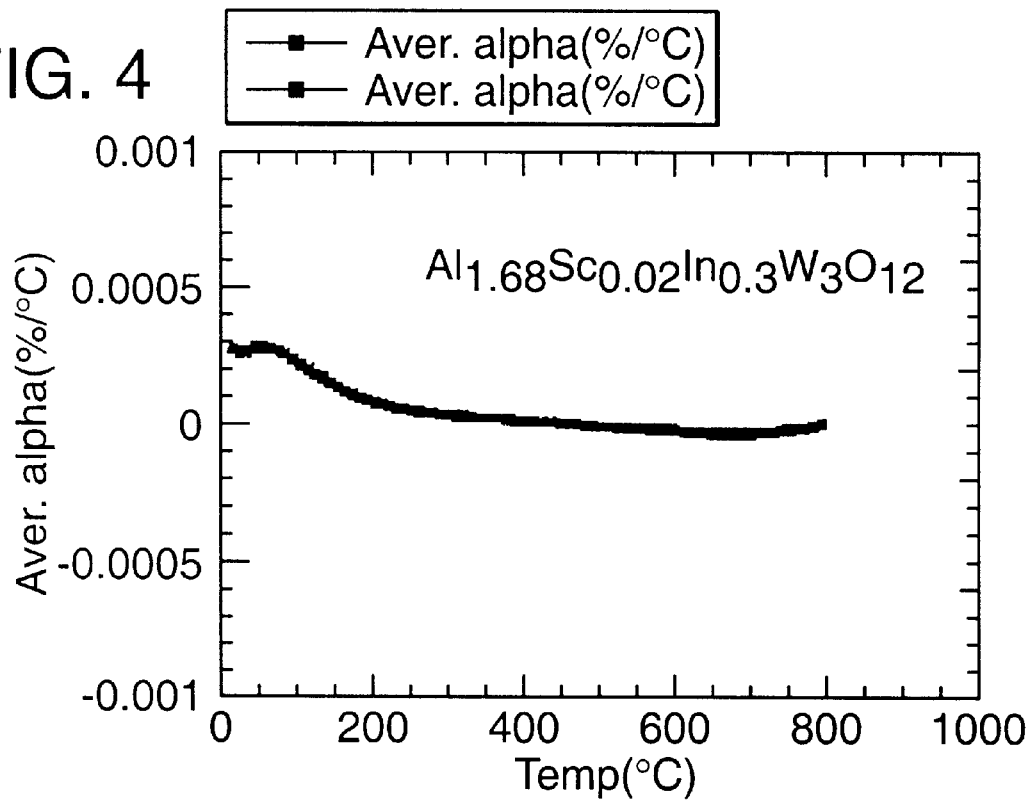
FIG. 4 is a thermal expansion curve illustrating the relative thermal expansion (%) of $Al_{1.68}Sc_{0.02}In_{0.3}W_3O_{12}$ over a temperature range of from about 0° C. to about 800° C.

FIG. 4 is a thermal expansion curve for $Al_{1.68}Sc_{0.02}In_{0.3}W_3O_{12}$, which was made according to Example 4. FIG. 4 shows that $Al_{1.68}Sc_{0.02}In_{0.3}W_3O_{12}$ has substantially zero thermal expansion at about room temperature to about 50° C. At this temperature, $Al_{1.68}Sc_{0.02}In_{0.3}W_3O_{12}$ has negative thermal expansion until heated to a temperature of about 200° C. Thereafter, $Al_{1.68}Sc_{0.02}In_{0.3}W_3O_{12}$ again shows substantially zero thermal expansion up to a temperature of at least about 600° C.

Example 5

This example describes the preparation of $Hf_2WP_2O_{12}$. 2.1049 grams of $HfO_2$ (FW=210.49; 0.01 moles), 1.1592 grams of $WO_3$ (0.00499 moles) and 1.1503 grams of $NH_4H_2PO_4$ (FW=115.03; 0.01 moles) were ground together using an agate mortar and pestle. This intimate mixture was heated in a platinum crucible in air at about 600° C. for about 4 hours, reground, and then heated at 1,250° C. for 10 hours. The mixture was reground and heated a second time at 1,250° C. for 10 hours. X-ray diffraction showed single phase $Hf_2WP_2O_{12}$.

Figure 5:
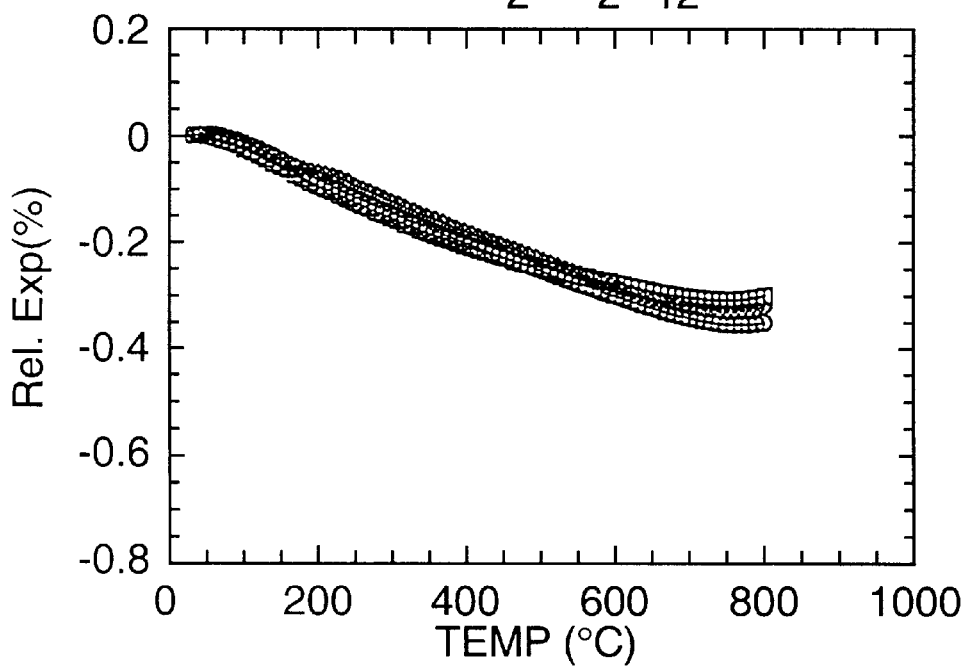
FIG. 5 is a thermal expansion curve illustrating the relative thermal expansion (%) of $Hf_2WP_2O_2$ over a temperature range of from about 0° C. to about 800° C.

FIG. 5 is a thermal expansion curve for $Hf_2WP_2O_{12}$, which was made according to Example 5. FIG. 5 shows that $Hf_2WP_2O_{12}$ has negative thermal expansion beginning at about room temperature and continuing to at least about 600° C.

The compounds shown in Table 1 have been synthesized in manners similar to that described above in Examples 1–5. Table 1 also shows thermal expansion data for each of the compounds listed. The thermal expansion data provided in Table 1 was obtained using a dilatometer.

Figure 6:
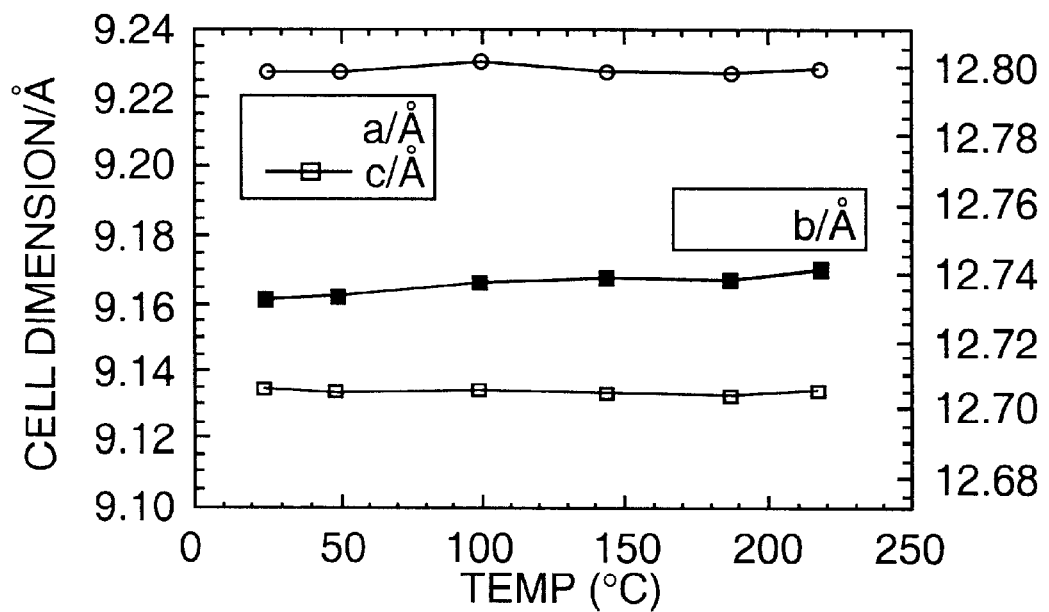
FIG. 6 is a thermal expansion curve illustrating the change in cell dimensions of $Al_{1.6}In_{0.4}W_3O_{12}$ over a temperature range of from about 0° C. to about 250° C.

FIG. 6 provides a thermal expansion curve obtained by diffraction. FIG. 6 is graph showing the change in cell dimensions of $Al_{1.6}In_{0.4}W_3O_{12}$ over a temperature range of from about 0° C. to about 220° C. FIG. 6 illustrates that $Al_{1.6}In_{0.4}W_3O_{12}$ has nearly isotropic, very low thermal expansion over the temperature range tested.

TABLE 1

| COMPOUND | $\alpha^1$ |
| --- | --- |
| $Al_{1.5}In_{0.5}W_3O_{12}$ | 1.0 |
| $Al_{1.6}In_{0.4}W_3O_{12}$ | 1.5 |
| $Al_{1.7}In_{0.3}W_3O_{12}$ | 0.2 |
| $Al_{1.8}In_{0.2}W_3O_{12}$ | −1 |
| $YAlW_3O_{12}$ | −5 |
| $ScAlW_3O_{12}$ | −1 |
| $ScGaW_3O_{12}$ | −5 |
| $ScInW_3O_{12}$ | −1 |
| $ScHoW_3O_{12}$ | −7 |
| $ScYbMo_3O_{12}$ | −5 |
| $ErInW_3O_{12}$ | 10 |
| $Al_{1.68}Sc_{0.02}In_{0.3}W_3O_{12}$ | 0 |
| $Hf_2WP_2O_{12}$ | −5 |
| $Hf_2MoP_2O_{12}$ | −4 |

[1]All values reported in Table 1 are $\times 10^{-6}$, and the units are either °C. or K.

Compounds synthesized as illustrated in Examples 1–5 also can be used for making compositions and articles useful for resisting thermal expansion. Compounds of the present invention have a variety of potential applications both as pure phases and as compositions with overall coefficients of thermal expansion that can be adjusted to a desired value. Zero thermal expansion materials and compositions can be obtained, and nearly isotropic thermal expansion also can be obtained. Possible uses for compounds and compositions of the present invention include, but are not limited to, circuit boards, optical substrates, low-temperature thermocouples, dental restorations, catalyst supports, ceramics and cookware.

Example 6

This example describes a preparation of a ceramic composition containing the low or negative thermal expansion materials discussed above. A ceramic material, such as $Zr_2O_3$, is obtained. To the ceramic material is added a sufficient amount of a low or negative thermal expansion compound according to the present invention so that the resulting composition has a slightly positive, a substantially zero or a negative thermal expansion. Suitable amounts of the low or negative thermal expansion material to be added to the ceramic material are likely from about 10 volume % to about 95 volume %. This forms a composition within the scope of the present invention.

IV. General Method for Making NTE Materials

The present invention also provides a method for making NTE materials. The method comprises (1) designing compounds according to rules derived empirically by making many NTE compounds and assessing common characteristics of such compounds, and (2) making those compounds designed according to the rules using the synthetic methodology described above. A method for assessing the potential NTE behavior of a compound also is described. The method comprises (1) considering candidate compounds for potential negative thermal expansion, and (2) culling the candidate compounds to those likely to show NTE behavior by applying the rules.

The rules are as follows:

1. NTE compounds should have open network structures where the oxygens of the network all have a coordination of two. It is acceptable to have some oxygens coordinated to only one metal. These oxygen atoms are not considered part of the network because they do not connect anything to anything. There should be no oxygens coordinated to three or more metal atoms;
2. NTE compounds should have strong metal-oxygen bonds. While "strong" has not yet been completely defined quantitatively, "strong" does seem to indicate that the metal cations of the network should have oxidation states of three or higher;
3. NTE compounds should not include any ions, such as $Na^+$, atoms or molecules, such as $H_2O$, inside the crystalline network; and
4. $MO_x$ polyhedra of the network of NTE compounds must be free to rotate with little or no change in size or shape of the polyhedra. If some change in the shape of the polyhedra is required, it is then important for the cations to be large, and the larger the better because then the polyhedra distort easier. For most compounds of the present invention rotations generally cannot occur without some small change in the shape of the polyhedra. But, changes in shape do not seem to be required for $NbO_2F$ and $TaO_2F$.
5. The cations of the network should be as electropositive as possible. This increases the negative charge on oxygen and thus suppresses the phase transition below which negative thermal expansion does not occur.

Compounds have been designed and made by applying rules 1–5. For example, $NbO_2F$ and $TaO_2F$ have been made as illustrated in Examples 1–5. Dilatometer measurements indicate that both of these compounds are negative thermal expansion materials.

The present invention has been described with reference to preferred embodiments. It will be understood by persons of ordinary skill in the art that the invention can vary from that described herein, and still be within the scope of the following claims.

We claim:

1. A compound according to the formula $A_{2-x}^{3+}A_y^{4+}M_z^{3+}M_{3-y}^{6+}P_yO_{12}$ where $A^{3+}$ is a metal having an oxidation state of plus 3, $A^{4+}$ is a metal having an oxidation state of plus 4, $M^{3+}$ is a metal having an oxidation state of plus 3, $M^{6+}$ is a metal having an oxidation state of plus 6, y varies from about 0 to about 2, x is equal to the sum of y and z and varies from about 0.1 to about 1.9.

2. The compound according to claim 1 where y=0, x is from about 0.1 to about 1.9, z=x, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

3. The compound according to claim 1 where y=1, x=1+z, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

4. The compound according to claim 1 where y=2, x=2, z=0, $A^{4+}$ is Hf, and $M^{6+}$ is W, Mo, or mixtures thereof.

5. The compound according to claim 2 selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$ and $ErInW_3O_{12}$.

6. The compound according to claim 2 selected from the group consisting of $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$ and $ScYbMo_3O_{12}$.

7. The compound according to claim 1 which further satisfies the formula $Al_{2-x}In_xW_3O_{12}$ where x is from about 0.1 to about 1.9.

8. The compound according to claim 7 selected from the group consisting of $Al_{1.5}In_{0.5}W_3O_{12}$, $Al_{1.6}In_{0.4}W_3O_{12}$, $Al_{1.7}In_{0.3}W_3O_{12}$ and $Al_{1.8}In_{0.2}W_3O_{12}$.

9. A composition having a thermal expansion less than that of a material included in the composition, the composition comprising:
   a first material, the first material having low or negative thermal expansion and having a formula of $A_{2-x}^{3+}A_y^{4+}M_z^{3+}M_{3-y}^{6+}P_yO_{12}$ where $A^{3+}$ is a metal having an oxidation state of plus 3, $A^{4+}$ is a metal having an oxidation state of plus 4, $M^{3+}$ is a metal having an oxidation state of plus 3, $M^{6+}$ is a metal having an oxidation state of plus 6, y varies from about 0 to about 2 and x equals the sum of y and z; and
   a second material, the second material exhibiting a positive thermal expansion.

10. The composition according to claim 9 wherein y=0, x is from about 0.1 to about 1.9, z=x, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

11. The composition according to claim 9 where y=0, x is from about 0 to about 2, z=x, $A^{3+}$ and $M^{3+}$ are selected from the group consisting of Al, Cr, Er, Fe, Ga, Ho, In, Lu, Tm, Y, Yb, and mixtures thereof, and $M^{6+}$ is W, Mo, or mixtures thereof.

12. The composition according to claim 9 where y=1, x=1+z, $A^{3+}$ and $M^{3+}$ are selected from the group consisting of Al, Cr, Er, Fe, Ga, Ho, In, Lu, Sc, Tm, Y, Yb, and mixtures thereof, and $M^{6+}$ is W, Mo, or mixtures thereof.

13. The composition according to claim 9 where y=2, x=2, z=0, $A^{4+}$ is selected from the group consisting of Hf, Zr, and mixtures thereof, and $M^{6+}$ is W, Mo, or mixtures thereof.

14. The composition according to claim 9 where the first material is selected from the group consisting of $Al_2W_3O_{12}$, $Al_2Mo_3O_{12}$, $In_2W_3O_{12}$, $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$, $Al_{1.68}Sc_{0.02}In_{0.3}W_3O_{12}$, $Zr_2WP_2O_{12}$, $Zr_2MoP_2O_{12}$, $Hf_2WP_2O_{12}$, $Hf_2MoP_2O_{12}$, and mixtures thereof.

15. The composition according to claim 9 where the first material is selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$ and mixtures thereof.

16. The composition according to claim 9 where the first material is selected from the group consisting of $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$ and mixtures thereof.

17. The composition according to claim 9 where the first material further satisfies the formula $Al_{2-x}In_xW_3O_{12}$ where X is from about 0.1 to about 1.9.

18. The composition according to claim 17 where the first material is selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$ and mixtures thereof.

19. The composition according to claim 9 where the first material is selected from the group consisting of $Hf_2WP_2O_{12}$, $Hf_2MoP_2O_{12}$, and mixtures thereof.

20. A method for decreasing the positive thermal expansion of a material, the method comprising:
   providing a first material that exhibits low or negative thermal expansion, the first material having a formula of $A_{2-x}^{3+}A_y^{4+}M_z^{3+}M_{3-y}^{6+}P_yO_{12}$ where $A^{3+}$ is a metal having an oxidation state of plus 3, $A^{4+}$ is a metal having an oxidation state of plus 4, $M^{3+}$ is a metal having an oxidation state of plus 3, $M^{6+}$ is a metal having an oxidation state of plus 6, y varies from about 0 to about 2 and x equals the sum of y and z;
   providing a second material that exhibits positive thermal expansion; and
   adding an effective amount of the first material to the second material to form a composition having a decreased positive thermal expansion relative to the second material.

21. The method according to claim 20 where the first material is selected from the group consisting of $Al_2W_3O_{12}$, $Al_2Mo_3O_{12}$, $In_2W_3O_{12}$, $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$, $Al_{1.68}Sc_{0.02}In_{0.3}W_3O_{12}$, $Zr_2WP_2O_{12}$, $Zr_2MoP_2O_{12}$, $Hf_2WP_2O_{12}$, $Hf_2MoP_2O_{12}$, and mixtures thereof.

22. The method according to claim 20 where the first material is selected from the group consisting of $Al_{1.5}In_{0.5}W_3O_{12}$, $Al_{1.6}In_{0.4}W_3O_{12}$, $Al_{1.7}In_{0.3}W_3O_{12}$, $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, $ErInW_3O_{12}$, $Al_{1.68}Sc_{0.02}In_{0.3}W_3O_{12}$, and mixtures thereof.

23. The method according to claim 20 where the first material is a negative thermal expansion material selected from the group consisting of $Al_{1.8}In_{0.2}W_3O_{12}$, $YAlW_3O_{12}$, $ScAlW_3O_{12}$, $ScGaW_3O_{12}$, $ScInW_3O_{12}$, $ScHoW_3O_{12}$, $ScYbMo_3O_{12}$, and mixtures thereof.

24. The method according to claim 20 where the first material is selected from the group consisting of $Hf_2WP_2O_{12}$, $Hf_2MoP_2O_{12}$, and mixtures thereof.

* * * * *

UNITED STATES PATENT AND TRADEMARK OFFICE
CERTIFICATE OF CORRECTION

PATENT NO.  : 5,919,720

DATED       : Jul. 6, 1999

INVENTOR(S) : Sleight et al.

It is certified that error appears in the above-identified patent and that said Letters Patent is hereby corrected as shown below:

Column 7, line 39, replace "$1n_2O_3$" with --$In_2O_3$--;

Column 2, line 13, replace "$Li_2O.Al_2O_3.2SiO_2$" with --$Li_2O \bullet Al_2O_3 \bullet 2SiO_2$--.

Signed and Sealed this

Twenty-sixth Day of December, 2000

Attest:

Q. TODD DICKINSON

*Attesting Officer*     *Director of Patents and Trademarks*